United States Patent [19]

Nishihara et al.

[11] Patent Number: 4,944,086

[45] Date of Patent: Jul. 31, 1990

[54] METHOD AND APPARATUS FOR ASSEMBLING ELECTRONIC AND/OR ELECTRIC PARTS TO BASE MEMBER

[75] Inventors: Tokihiro Nishihara, Chiba; Yasushi Fukuda, Kanagawa, both of Japan

[73] Assignee: Sony Corporation, Tokyo, Japan

[21] Appl. No.: 191,956

[22] Filed: May 9, 1988

[30] Foreign Application Priority Data

May 19, 1987 [JP] Japan ................. 62-122119

[51] Int. Cl.⁵ .................... H05K 3/30; B23P 19/00
[52] U.S. Cl. ......................... 79/837; 29/741; 140/147
[58] Field of Search ............. 29/739, 741, 837, 838, 29/839, 564.1, 564.6, 564.8; 140/147

[56] References Cited

U.S. PATENT DOCUMENTS

| | | | |
|---|---|---|---|
| 4,312,109 | 1/1982 | Kawana et al. | 29/739 X |
| 4,472,668 | 9/1984 | Mutschler et al. | 29/741 X |
| 4,510,683 | 4/1985 | Fedde et al. | 29/741 X |
| 4,598,456 | 7/1986 | McConnell | 29/741 X |
| 4,621,419 | 11/1986 | Hino et al. | 29/837 |
| 4,654,964 | 4/1987 | Schneider et al. | 29/741 X |
| 4,705,081 | 11/1987 | Birk et al. | 29/837 X |
| 4,833,776 | 5/1989 | Wakamiya et al. | 29/593 |

FOREIGN PATENT DOCUMENTS 49-9824   1/1974   Japan .
51-149562 12/1976   Japan .

Primary Examiner—Carl E. Hall
Assistant Examiner—Carl J. Arbes
Attorney, Agent, or Firm—Ronald P. Kananen

[57] ABSTRACT

An electronic and/or electric parts assembling apparatus inserts a pin or pins of the electronic and/or electric parts with a predetermined pressure in a chuck released condition. Magnitude of motion of the electric and/or electric parts is monitored for detecting completion of insertion.

37 Claims, 10 Drawing Sheets

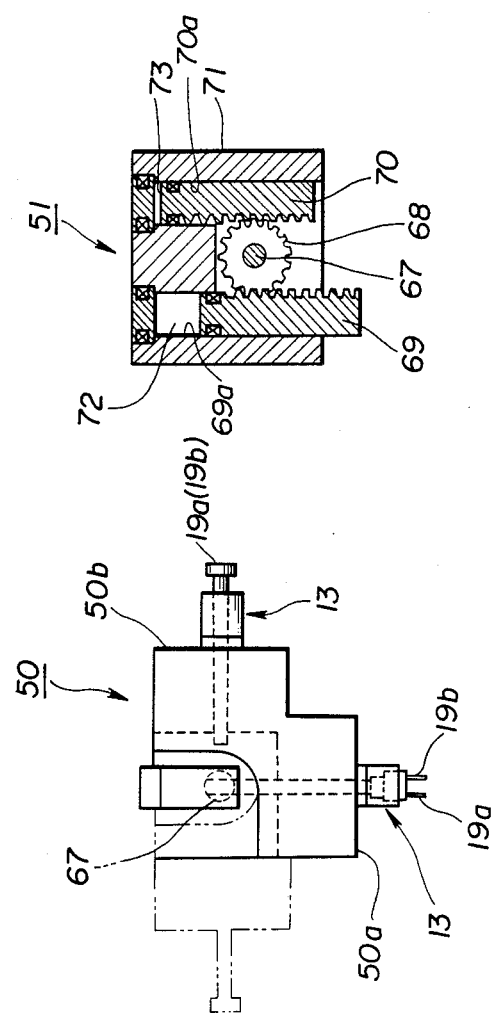

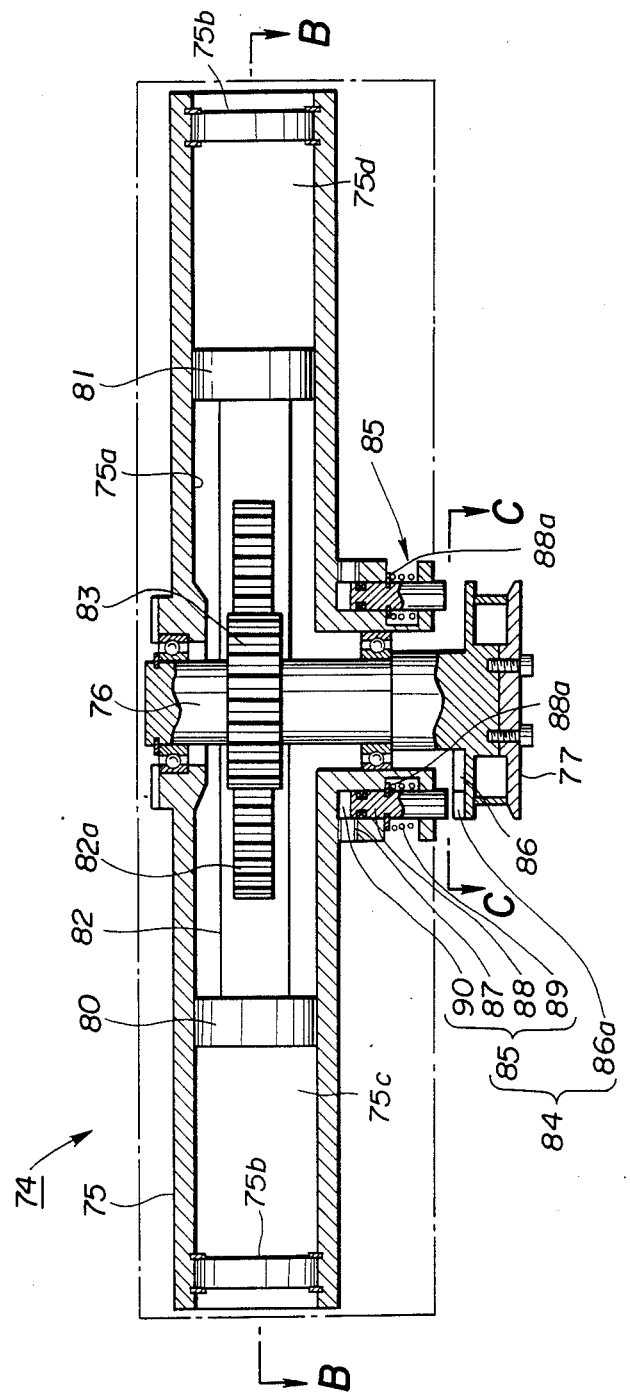

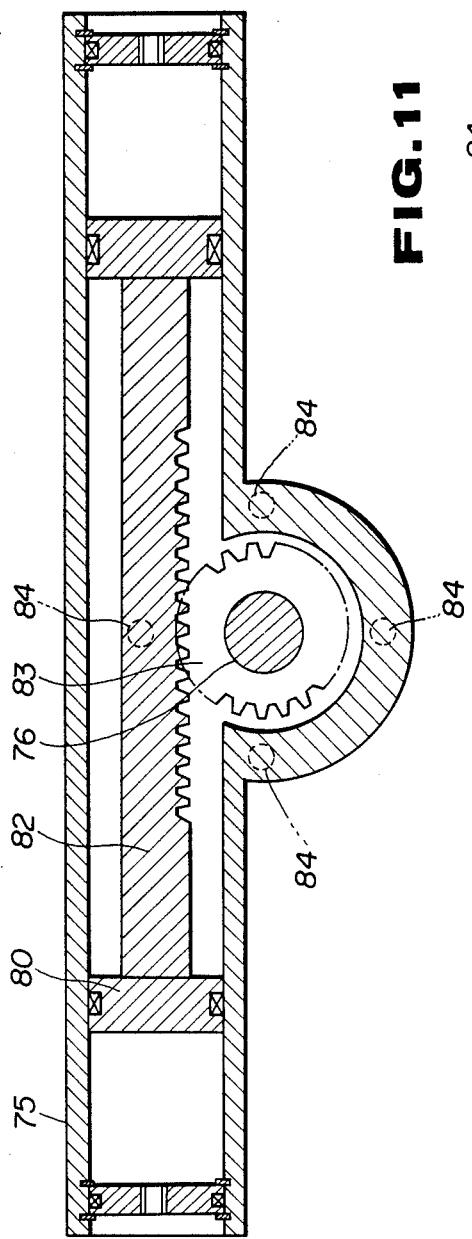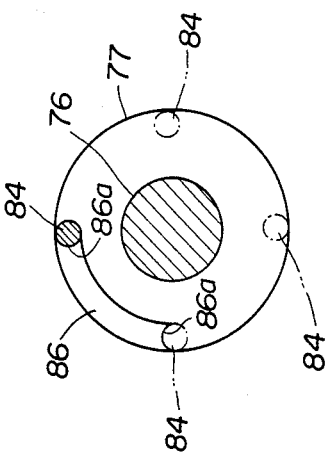

METHOD AND APPARATUS FOR ASSEMBLING ELECTRONIC AND/OR ELECTRIC PARTS TO BASE MEMBER

BACKGROUND OF THE INVENTION

1. Field of the Invention

The present invention relates generally to an apparatus for assembling electronic and/or electric parts, such as an IC chips to a base member, such as a substrate of a circuit board. More specifically, the invention relates to an electronic and/or electric parts assembling apparatus which is particularly adapted for assembling parts having connector pins or legs to be inserted into openings formed through a substrate.

2. Description of the Background Art

Japanese Patent First (unexamined) Publication (Tokkai) Showa No. 51-149562 and Japanese Patent Second (examined) Publication (Tokko) Showa No. 49-9824 discloses an electronic parts assembling apparatus for assembling electronic parts to a substrate. Such apparatus has a chucking mechanism chucking an electronic part to be assembled. The chucking mechanism is driven on a two-dimensional coordinate system formed on a plane substantially in parallel to a base member, such as a substrate of a circuit board, by means of a transverse driving mechanism. The chucking mechanism is also driven along an axis substantially perpendicular to the aforementioned two-dimensional coordinate system toward and away from the base member by means of an axial driving mechanism. The electronic parts as a workpiece is carried by the chucking mechanism to a position in the aforementioned coordinate system, to assemble the part onto the base member, by the transverse driving mechanism. Subsequently, the chucking mechanism is driven toward the base member to assemble the electronic part to the base member by inserting a pin or a leg thereof into an opening formed through the base member.

In such conventional apparatus, the chucking mechanism maintains the part until the pin is fully inserted. Faulty insertion of the pin is detected by detecting stress strain generated at a clinch edge of an anvil mechanism by means of strain gauge or piezoelectric element.

In the conventional apparatus set forth above, because the chuck mechanism is driven toward the base member by means of the axial driving mechanism carrying the electronic part, the pin tends to be bent or, in the worst case, damaged when the position of the pin is offset from the opening for insertion to insert. On the other, when the electronic part with more than one pin is provided, it is possible to detect faulty insertion after clamping one or more pins by means of the clinch edge. Namely, when one or some of the pins are accurately inserted and clamped, faulty insertion of one of the pins cannot be detected until the clinch edge reaches the pin inserted in failure. In such case, the parts assembled in failure have to be removed from the base before releasing the clamped pin from the base. This operation has to be done manually.

SUMMARY OF THE INVENTION

With the defect in the background art in mind, it is an object of the present invention to provide an apparatus for assembling electronic and/or electric parts to a base member which can eliminate a possibility of damaging connector pins.

In order to accomplish the aforementioned and other objects, an electronic and/or electric parts assembling apparatus, according to the present invention, inserts a pin or pins of the electronic and/or electric parts with a predetermined pressure in a chuck released condition. The magnitude of motion of the electric and/or electric parts is monitored for detecting completion of insertion.

According to one aspect of the invention, an apparatus for assembling an electronic and/or electric part on a substrate, which part has a connector pin to be inserted through an opening formed through the substrate, comprises:

means for holding the part and carrying the latter to a predetermined orientation in relation to a substrate, at which the pin of the part is aligned to the opening;

means for shifting the part holding means toward the substrate for inserting the pin into the opening;

means, cooperative with the shifting means, for monitoring magnitude of shifting of the part holding means to detect the part holding means at a predetermined position relative to the substrate, at which the pin is inserted into the pin in a predetermined small magnitude;

means, responsive to the monitoring means detecting the part holding means at the predetermined position, for deactivating the shifting means and releasing the part holding means;

means, responsive to the deactivating means releasing holding, for exerting a controlled magnitude of depression force to further insert the pin through the opening;

means for monitoring position of the part to detect the position of the part where the pin is fully inserted through the opening; and means, responsive to the part position monitoring means detecting the fully inserted position of the pin, for clamping an end of the pin for fixing the part on the substrate.

According to another aspect of the invention, an apparatus for automatically assembling an electronic and/or electric part on a substrate, which part has a connector pin to be inserted through an opening formed through the substrate, comprises:

chucking means for chucking the part at a predetermined chucking station to which the part is supplied and carrying the latter to a predetermined orientation in relation to a substrate, at which the pin of the part is aligned to the opening, from the chucking station;

shifting means for driving the chucking means to cause shifting of the chucking means in a direction perpendicular to the substrate and toward the substrate for inserting the pin into the opening;

releasing means, cooperative with the chucking means, for monitoring a magnitude of shifting of the chucking means to detect the part at a predetermined position relative to the substrate, at which the pin is inserted into the pin in a predetermined small magnitude in relation to a full stroke of insertion, deactivating the shifting means and operating the chucking means for release chucking for making the part free from the chucking means;

depressing means, responsive to the releasing means, for exerting a controlled magnitude of depression force to further insert the pin through the opening;

depression magnitude monitoring means for monitoring position of the part to detect the position of the part where the pin is fully inserted through the opening; and clamping means, responsive to the part position monitoring means detecting the fully inserted position of the pin, for clamping an end of the pin for fixing the part on the substrate.

In the preferred construction, the depressing means exerts the depression force, the magnitude of which is determined in view of bending strength of the pin and is set smaller than the bending strength. Practically, the depressing means comprises a mechanical component which resiliently generates the depression force and a pneumatic component which pneumatically generates the depression force. The mechanical component of the depressing means is maintained at a pre-loaded condition while the chucking means holds the part and normally exerts the depression force to the part. The pneumatic component is cooperative with the mechanical component and is active after the mechanical component completes depression for its own full stroke for depression.

According to the preferred construction, the clamping means is cooperative with the chucking means so as to move in synchronism with movement of the chucking means for being constantly positioned in alignment with the chucking means across the substrate. The chucking means comprises a chuck mechanism for chucking the part, a chuck carrier mechanism carrying the chuck mechanism over the substrate for shifting the chuck mechanism on a plane substantially parallel to the substrate to position the chuck mechanism at the predetermined orientation, at which the pin of the part is aligned to the opening. The chuck carrier mechanism comprises a pivotal component mounting the chuck mechanism and pivotally movable on the plane, and a linearly shifting component associated with the pivotal component for linearly shifting the chuck mechanism with the pivotal component at least in a first direction.

Furthermore, the apparatus may further comprise means for mounting the substrate, which mounting means is movable in a second direction perpendicular to the first direction for adjusting a relative position of the chuck mechanism and the substrate in the second direction for aligning the pin to the opening. The clamping means comprises a clamping edge, a clamping edge carrier including a pivotal component which is pivotally movable for carrying the clamping edge in synchronism with pivotal movement of the pivotal component of the chucking means, and a linearly shifting component associated with the pivotal component for linearly shifting the clamping edge with the pivotal component in the first direction in synchronism with linear movement of the linearly shifting component of the the chucking means. The insertion monitoring means detects faulty insertion by detecting the part held at the position other than the position where the pin is fully inserted through the opening, to actuate the chucking means for hold the part to remove from the substrate.

Also, the apparatus may further comprise a jig for straightening the pin removed from the substrate, wherein the chucking means carries the part, about which faulty insertion is detected, to the jig for repairing. Alternatively, the chucking means may be operative to re-align the part for re-alignment of the pin to the opening for re-insertion.

According to a further aspect of the invention, a method for assembling an electronic and/or electric part on a substrate, which part has a connector pin to be inserted through an opening formed through the substrate, comprises the steps of:

holding the part;

carrying the part to a predetermined orientation in relation to the substrate, at which the pin of the part is aligned to the opening;

shifting the part toward the substrate for inserting the pin into the opening;

monitoring magnitude of shifting of the part to detect at a predetermined position relative to the substrate, at which the pin is inserted into the opening in a predetermined small magnitude;

detecting the part at the predetermined position, for stopping shift of the part toward the substrate;

releasing the part from holding;

exerting a controlled magnitude of depression force to further insert the pin through the opening in response to releasing of holding;

monitoring positioning of the part to detect the position of the part where the pin is fully inserted through the opening; and detecting the fully inserted position of the pin, for clamping an end of the pin for fixing the part on the substrate.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings:

FIG. 7 is an enlarged side elevation of a chuck housing in the chuck mechanism;

FIG. 8 is an enlarged section taken along line VIII—VIII of FIG. 6;

FIG. 9 is a section of a rotatingly driving mechanism employed in the assembling apparatus of the invention;

FIG. 10 is a section taken along line X—X of FIG. 9;

FIG. 11 is a section taken along line XI—XI of FIG. 9;

DESCRIPTION OF THE PREFERRED EMBODIMENT

Figure 1:
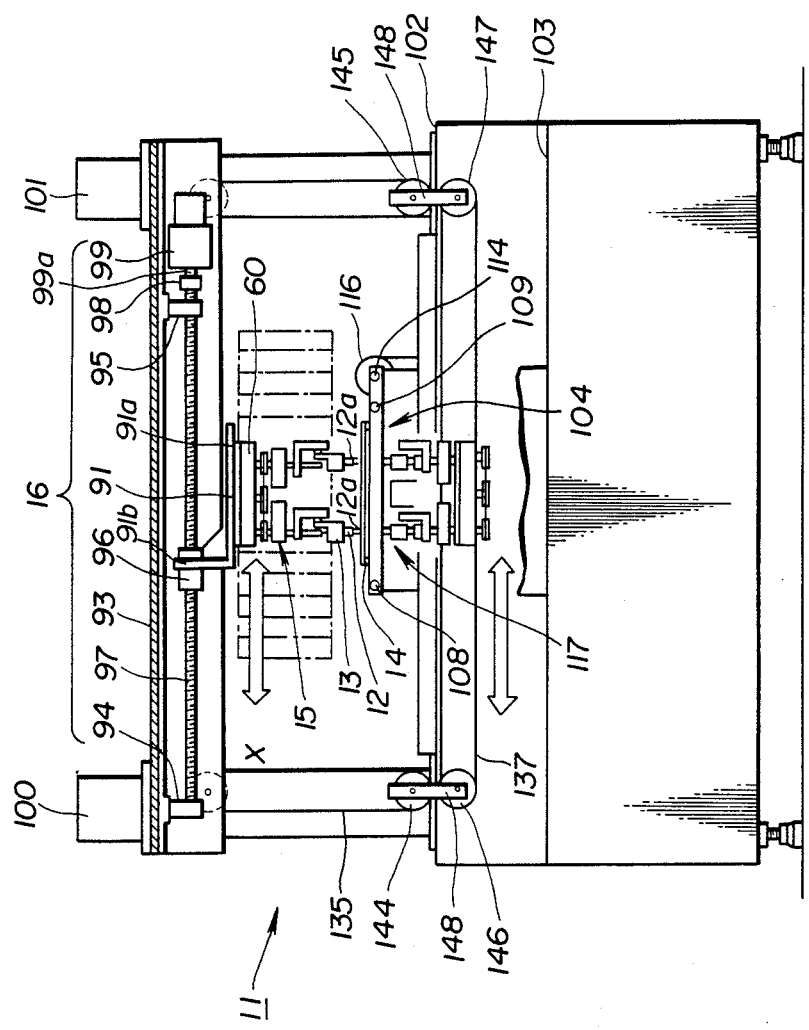
FIG. 1 is a front elevation of the preferred embodiment of an electronic parts assembling apparatus according to the invention.
Figure 2:
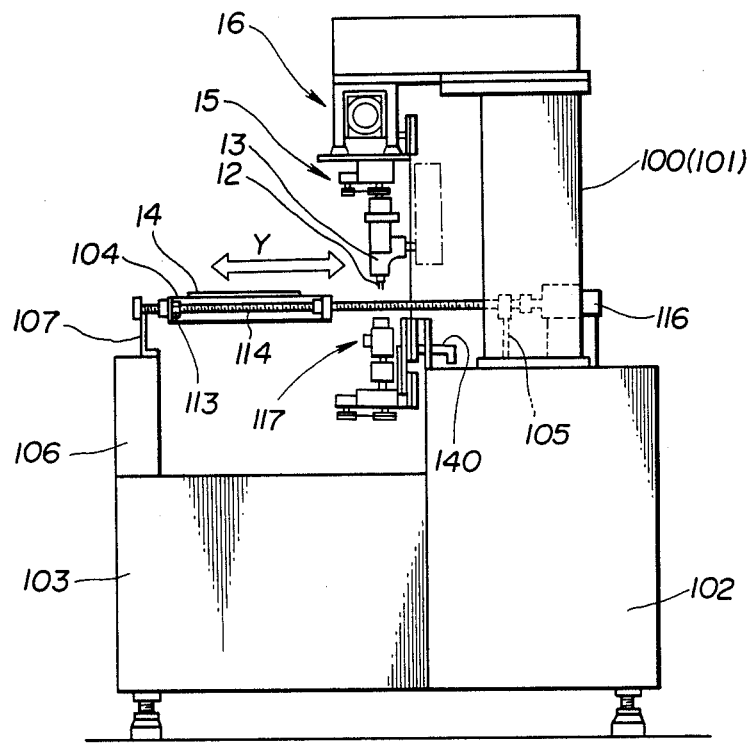
FIG. 2 is a side elevation of the preferred embodiment of the electronic parts assembling apparatus of FIG. 1.
Figure 5:
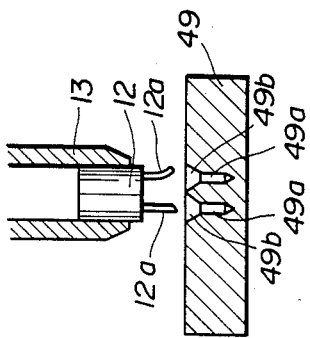
FIG. 5 is a sectional view of a jig for repairing bent pin of the electronic parts.

Referring now to the drawings, particularly to FIGS. 1 and 2, the preferred embodiment of an assembling apparatus for assembling an electric or an electronic part or parts 12, such as an integrated circuit (IC) chip or chips, to a substrate, according to the present invention, is generally represented by the reference numeral 11. As seen from FIGS. 1 and 2, the electronic part 12 is provided with one or more connector pins 12a extending from the part body and made of an electrically conductive material for establishing electrical communication. The connector pin also serves as a fixture for the electronic part onto a base member 14, such as a substrate of a circuit board. Each pin 12a of the electronic part 12 is designed to be inserted through an opening 14a (shown in FIG. 3) and extends therethrough to be clamped at the side opposite to the side where the part body is mounted for fixing the electronic part on the substrate. The assembling apparatus 11 has a chuck mechanism 13 which chucks the electronic parts 12. The chuck mechanism 13 is associated with a drive mechanism 15 to be driven toward and away from a substrate 14 which forms a base member for assembling the electronic parts thereto. In the shown embodiment the drive mechanism 15 drives the chuck mechanism 13 in a vertical direction along the axis of the chuck mechanism. Hereafter, this drive mechanism 15 will be referred to as an "axial driving mechanism". The chuck mechanism 13 is also associated with another drive mechanism 16. The driving mechanism 16 drives the chuck mechanism 13 transversely to the axis of the chuck mechanism and thus will be hereafter referred to as a "transverse driving mechanism". The transverse driving mechanism 16 drives the chuck mechanism 13 substantially in parallel to the substrate 14 between a chucking position, at which the chuck mechanism chucks the electronic parts 12 and predetermined assembling position, at which the electronic parts is assembled to the substrate 14.

Figure 4:
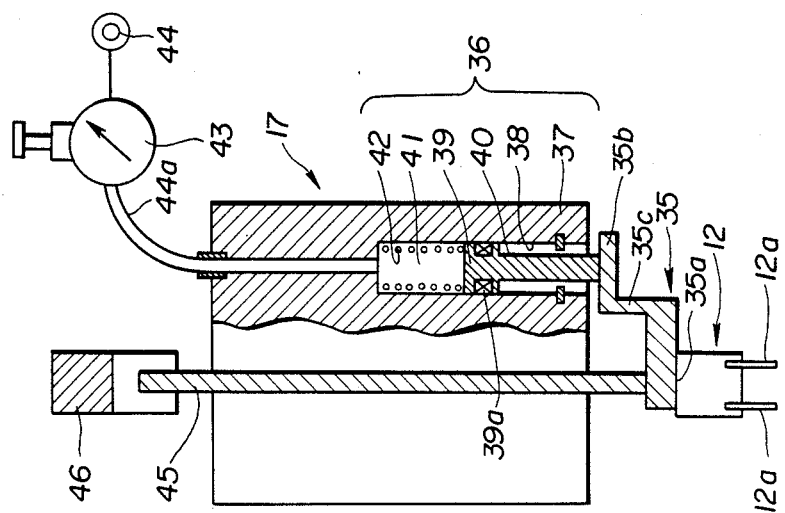
FIG. 4 is an enlarged section of an electronic parts depressing arrangement employed in the preferred embodiment of the assembling apparatus of FIGS. 1 and 2 and cooperating with the chuck mechanism of FIG. 3.
Figure 3:
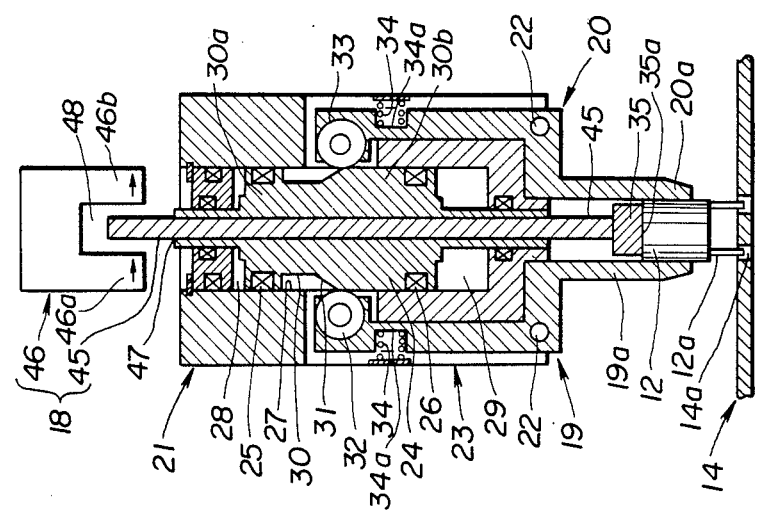
FIG. 3 is an enlarged section of a chuck mechanism incorporating an electronic parts insertion magnitude monitoring arrangement, which chuck mechanism is employed in the preferred embodiment of the assembling apparatus of FIGS. 1 and 2.

In the practical assembling operation, the chuck mechanism 13 is initially placed at the chucking position. To the chucking position, the electronic part 12 is supplied. The chuck mechanism 13 chucks the supplied electronic part 12. Then, the transverse driving mechanism 16 drives the chuck mechanism 13 to shift the latter above the substrate 14 to the predetermined assembling position. When the chuck mechanism 13 is positioned at the assembling position, the axial driving mechanism 15 becomes active to drive the chuck mechanism with the electronic part 12 toward the substrate 14. By movement toward the substrate, the pins 12a of the electronic part 12 inserted into the corresponding openings 14a of the substrate 14. At the position at which the pins 12a are inserted into the opening 14a in a magnitude of 0.5 mm to 1 mm, the axial driving mechanism 15 stops driving. Then, then the chuck mechanism 13 releases the electronic part 12. At this position, a depression mechanism 17 which is shown in FIGS. 3 and 4 becomes active to depress the electronic part 12 toward the substrate with a predetermined pressure. The pressure to be exerted on the electronic part 12 by means of the depression mechanism 17 is selected to be small enough so as not to damage the pin or pins 12a. The magnitude of motion of the electronic part 12 as depressed by the depression mechanism 17 is monitored by means of an insertion magnitude monitoring sensor 18. This sensor 18 is designed to detect completion of insertion of the pins 12a through the openings 14a. When completion of insertion is detected, the depression mechanism 17 stops actuation.

Detailed construction of the preferred embodiment of the assembling apparatus according to the invention, will be discussed hereafter with reference to FIGS. 3 to 17. As shown in FIG. 3, the chuck mechanism 13 includes a pair of chucking arms 19 and 20 which have chucking claws 19a and 20a at the free ends thereof. The chucking arms 19 and 20 are associated with an air cylinder assembly 21 which forms a part of the depression mechanism 17 which will be discussed later.

The air cylinder assembly 21 comprises a cylinder body 23 to which the axial intermediate sections of the chucking arms 19 and 20 are pivoted by means of pivots 22. The air cylinder assembly 21 further comprises a piston 24 which is slidingly disposed within the hollow space defined within the cylinder body 23. This piston 24 is provided with sealing rings 25 and 26 which sealingly contact with the inner periphery of the cylinder body 23 to establish an air-tight seal and define upper and lower air chambers 28 and 29. The upper and lower air chambers 28 and 29 are communicated with an air pressure source (not shown) to introduce therefrom the pressurized air. The upper and lower air chambers 28 and 29 are also communicated with the ambient air via ventilation ports (not shown) for ventilating the air pressure. When the piston 24 is to be driven upwardly, the pressurized air is introduced into the lower pressure chamber 29 and the ventilation port of the upper air chamber 28 is open to ventilate the air pressure in the upper air chamber. By the pressure difference thus created, the piston 24 is driven upwardly. On the other hand, when the piston 24 is to be driven downwardly, the pressurized air is introduced into the upper pressure chamber 28 and the ventilation port of the lower air chamber 29 is open to ventilate the air pressure in the lower air chamber. By the pressure difference thus created, the piston 24 is driven downwardly.

As will be seen from FIG. 3, the piston 24 is formed to have a smaller diameter section 30a connected to the general section 30b having a diameter greater than that of the smaller diameter section and substantially corresponding to the internal diameter of the cylinder body 23. The smaller diameter section 30a and the general section 30b are connected by a tapered section 31. The profile of the piston 24 configured as set forth above serves as a cam surface for actuating the a chucking arms 19 and 20 between chucking position and a chuck releasing position.

The chucking arms 19 and 20 are provided with rollers 32 and 33 at the upper ends thereof. The chucking arms 19 and 20 are formed with recesses 34a at the position intermediate between the pivoted sections and the upper ends where the rollers 32 and 33 are provided. Coil springs 34 are seated on the recesses 34a at one end. The other ends of the coil springs 34 are seated on the cylinder body 23. Therefore, the chucking arms 19 and 20 are constantly biased inwardly at the upper portion above the pivoted portion. Consequently, the chucking arms 19 and 20 are normally biased in a chuck releasing direction. With this biasing force of the coil springs 34, the rollers 32 and 33 are forced toward the cam surface of the piston 24.

With this construction, while the piston 24 is held at the upwardly shifted position as shown in FIG. 3, the rollers 32 and 33 contact with the general section 30b maintain the chucking arms 19 and 20 at the chucking position against the coil springs 34. When the piston 24 shifts downwardly, the rollers 32 and 33 come into contact with the smaller diameter section 30a to allow the chucking arms 19 and 20 to reach the chuck releasing position. Therefore, as will be appreciated, as long as the chuck mechanism 13 holds the electronic part 12, the piston 24 is held in an upwardly shifted position.

The depression mechanism 18 is associated with the chucking mechanism 13 for cooperation therewith. The depression mechanism 18 has an actuation head 35 which is generally of a crank-shaped configuration having a contact section 35a contacting with the top end of the electronic part 12, as shown in FIG. 4. The actuation head 35 also has an upwardly shifted section 35b connected to an intermediate vertically extending section 35c. This actuation head 35 is associated with an air cylinder assembly 36 has a cylinder body 37 defining a hollow and downwardly open chamber 38. A power piston 39 with a seal ring 39a is sealingly and thrustingly disposed in the chamber 38 to define a pressure chamber 41. The power piston 39 is mechanically connected to the actuation head 35 via a piston rod 40. The pressure chamber 41 is communicated with a pressurized air source 44 via a pressure supply line 44a via a pressure regulator valve 43. A coil spring 42 is disposed within the pressure chamber 41 for normally exerting a downward biasing force to the actuation head 35.

While the chucking arms 19 and 20 of the chuck mechanism 13 are held in a chucking position, the actuation head 35 is held at a position shifted upwardly with the exerting spring force of the coil spring 42. In the practical operation, the electronic part 12 is carried by the chucking mechanism 13 in this condition. At the assembling position where the carried electronic part 12 is to be assembled to the substrate 14 and after inserting the lower end portion of the pins 12a into the openings 14a of the substrate in a given length, e.g. 0.5 mm to 1 mm, the chucking arms 19 and 20 are operated to the chuck releasing position, and the actuation head 35 with the electronic part 12 is shifted downwardly by the spring force of the coil spring 42. When further depression is required for completely inserting the pins 12a through the openings 14a, the air pressure is introduced into the pressure chamber 41.

It should be appreciated that the spring force of the coil spring 42 and the air pressure to be introduced into the pressure chamber 41 are adjusted so as not to cause deformation of the pins 12a even when the pins are not accurately inserted into the openings 14a or offset from the opening.

The insertion magnitude monitoring sensor 18 comprises a rod member 45 thrustingly received through an axial opening 47 formed through the piston 24. The lower end of the rod member 45 is positioned to contact with the contact section 35a of the actuation head 35. Adjacent the top of the rod member 45, a high resolution type photo-microsensor 46 is provided for monitoring magnitude of displacement of the top end of the rod member and thereby monitors insertion magnitude of the pins 12a. The photo-microsensor 46 defines a rod receptacle recess 48 between a light emitting section 46a and a photo sensing section 46b, to receive the top end of the rod member 45. The rod receptacle recess 48 is so designed as to receive the top end of the rod member 45 in a magnitude so that the received top end interferes with the light emitted from the light emitting section 46a when the chucking mechanism 13 accurately chucks the electronic part 12, and to allow the top end moving away from the recess to fully irradiate the light emitted from the light emitting section 46a on the photo sensing section 46b when the rod member 45 is placed at the lowermost position corresponding to the fully inserted position of the pins 12a.

In the practical operation, the photo-microsensor 46 generates a faulty insertion indicative signal when the light emitted from the light emitting section 46a cannot be received. In this case, the chuck mechanism 13 is operated to chuck the electronic part 12 which is installed in failure, to carry the electronic part to a repairing section having a pin repairing jig 49 shown in FIG. 5. The jig 49 has openings 49a with a tapered upper guide sections 49b. The pins 12a of the electronic part 12 which is carried to the repairing section is inserted into the opening 49a through the guide section 49b. During this process, a pin which is bent due to faulty insertion can be straightened. Thereafter, the electronic part 12 is again carried by the chucking mechanism 13 to the the assembling position. Then, assembling operation is again performed. If faulty insertion is again detected by the photo-micro sensor 46, the electronic part 12 is again chucked and carried to be replaced by new one.

Figure 6:
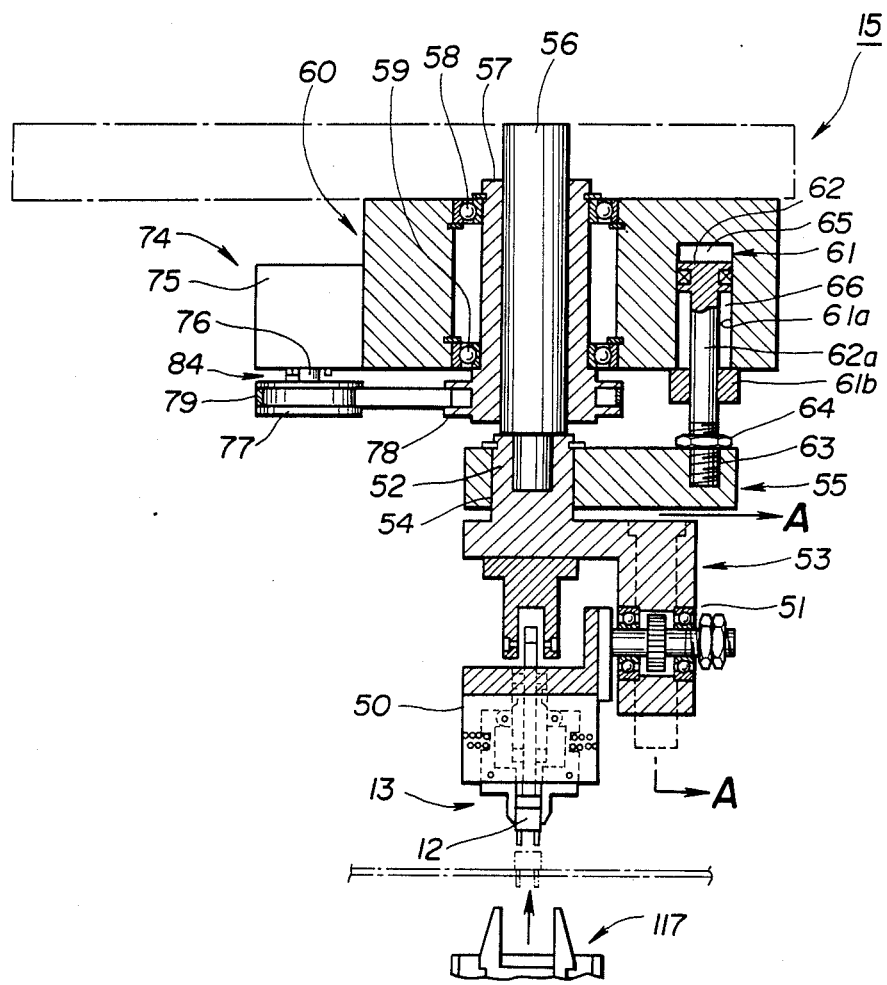
FIG. 6 is a section of an axial driving mechanism employed in the preferred embodiment of the assembling apparatus.
Figure 13:
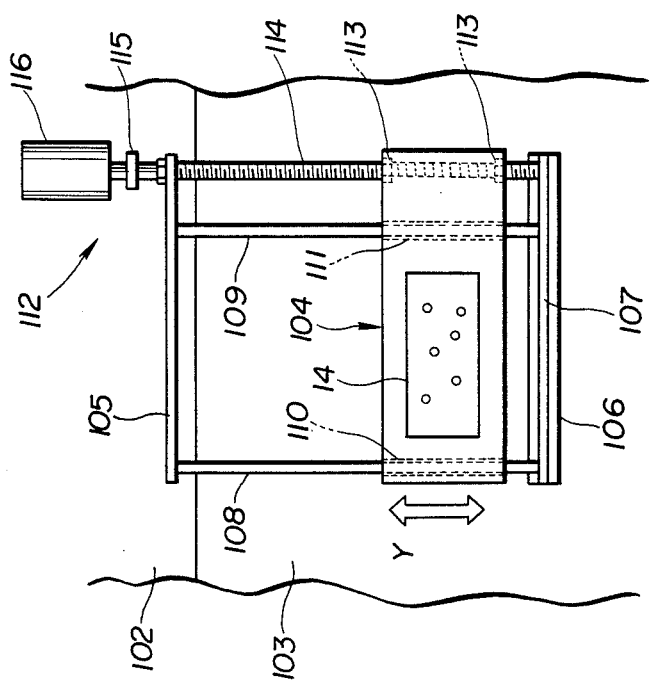
FIG. 13 is a substrate base and driving mechanism therefor, which is employed in the preferred embodiment of the assembling apparatus.

As shown in FIG. 6, the axially driving mechanism 15 includes a chuck housing 50 receiving the chuck mechanism 13. The chuck housing 50 is supported on a chuck holder 53 via a rotary bearing 51. The chuck housing 50 is pivotable about the axis of the rotary bearing 51 in a vertical direction in a range of 90°.

The chuck holder 53 is provided with an upwardly extending cylindrical boss section 52. The boss section 52 extends through an opening 54 formed through a rotary plate 55. The rotary plate 55 is pivotable about the axis of the boss section 52. The boss section 52 receives the lower end of a spline shaft 56. A bearing sleeve 57 surrounds the spline shaft 56. The bearing sleeve 57 allows thrusting motion of the spline shaft 56 but prevents rotational movement thereof. The bearing sleeve 57 is rotatably supported on a base frame 60 through bearings 58 and 59.

An air cylinder assembly 61 is provided in the base frame 60. The air cylinder assembly 61 comprises a cylindrical opening 61a defined in the base frame 60. The cylindrical opening 61a opens at the lower end thereof. The lower end of the opening 61a is closed by a seal block 61b. A piston 62 with a piston rod 62a is disposed within the cylindrical opening 61a to define upper and lower pressure chambers 65 and 66 which are connected to an air pressure source (not shown). The piston rod 62a has a threaded position 63 at the lower end. To the threaded lower end 63 of the piston rod 62a, a nut 64 engages for fixing the lower end to the rotary plate 55. With the construction set forth above, the piston 62 with the rotary plate 55, the chuck holder 53 and the chuck housing 50 are shifted downwardly by introducing pressurized air into the upper pressure chamber 65. On the other hand, the chuck housing 50 is driven upwardly by introducing pressurized air into the lower pressure chamber 66 which drives the piston upwardly to drive the chuck holder 53 through the rotary plate 55.

As shown in FIG. 7, the chuck housing 50 is configured in an essentially L-shape. The chuck housing 50 has a downwardly extending extension 50a and a laterally extending extension 50b. A pair of chucking claws 19a and 19b of mutually different chuck mechanisms 13 extend from each of the extensions 50a and 50b. These chuck mechanisms 13 are selected depending upon the type or configuration of the electronic part 12 to be assembled.

In order to rotatingly drive the chuck housing 50, the rotary bearing 51 is constructed in a form shown in FIG. 8. The rotary bearing 51 includes a rotary shaft 67 rigidly fixed to the chuck housing 50. The rotary shaft 67 is rotatably supported on the chuck holder 53 by means of an axially arranged pair of bearings. A pinion 68 is also fixed to the rotary shaft 67. The pinion 68 engages a pair of racks 69 and 70. These racks 69 and 70 are disposed within a pair of cylinders 69a and 70a defined at both sides of the pinion 68 in the chuck holder 53. Air chambers 72 and 73 are defined in the cylinders 69a and 70a, which air chambers communicate with a pressurized air source (not shown) via a pressure supply network (not shown). Though it is not clearly shown, the pressure supply network is designed for controlling the air pressure in the air chambers 72 and 73 in such a manner that when the air pressure in one of the air chambers 72 and 73 is increased, the air pressure in the other air chamber is reduced. Namely, assuming the rack 69 is initially placed at an upwardly shifted position and the air pressure in the air chamber 72 is increased, the air pressure in the air chamber 73 is reduced by the pressure supply network. As a result, the rack 69 is driven downwardly by the increased air pressure in the air chamber 72. By this, the pinion 68 is driven in a counterclockwise direction in FIG. 8. According to counterclockwise rotation of the pinion 68, the rack 70 is driven upwardly, with reducing the volume of the air chamber 73. Simultaneously, by rotation of the pinion 68, the rotary shaft 67 is driven to cause pivotal movement of the chuck housing 50. At the position of the rotary bearing 51, the chuck mechanism 13 associated with the extension 50a is active for chucking the electronic part 12. On the other hand, when the chuck mechanism 13 associated with the extension 50b is to be used, the pressurized air is introduced into the air chamber 73 to increase the air pressure therein to cause downward movement of the rack 70 to cause clockwise rotation of the pinion 68. According to clockwise rotation of the pinion, the rotary shaft 67 is driven to cause clockwise pivotal movement of the chuck housing 50 to direct the extension 50b downwardly as shown by phantom line in FIG. 7.

Furthermore, the axial driving mechanism 18 includes a rotatingly driving mechanism 74 for causing pivotal movement of the chuck holder 53 on the horizontal plane. The driving mechanism 74 has an air cylinder 75 which rotatingly drives an output shaft 76. A driving pulley 77 rigidly fixed to the lower end of the output shaft 76. The driving pulley 77 is connected to a driven pulley 78 via a driving belt 79. By the power train set forth above, the sleeve bearing 57 is rotatingly driven by rotational torque output through the output shaft 76. As shown in FIG. 9, the air cylinder 75 comprises an essentially cylindrical cylinder body 75a whose both ends are plugged by plugs 75b. A pair of pistons 80 and 81 are respectively disposed within the cylinder body 75a to define air chambers 75c and 75d which are connected to a pressurized air source via a pressure supply network which alternatively increases and decreases the air pressure in the air chambers.

The pair of pistons 80 and 81 are connected by a piston rod 82. A rack 82a is attached to the piston rod 82 for thrusting motion with the piston rod 82 according to pressure difference between the air chambers 75c and 75d. The rack 82a engages with a pinion 83 which is rigidly fixed to the output shaft 76.

With this construction, the output shaft 76 is driven in alternative directions according to the direction of thrusting motion of the piston rod 82 carrying the rack 82a.

In the shown embodiment, the drive mechanism 74 drives the chuck holder 53 at angular positions between an initial or reference position, a 90° shifted position, a 180° shifted position and a 270° shifted position. In order to position the chuck holder 53 at a respective one of aforementioned angular positions, a positioning mechanism 84 is provided on the air cylinder 75. The positioning mechanism 84 is arranged at four angular positions respectively corresponding to the initial or reference position, the 90° shifted position, the 180° shifted position and the 270° shifted position of the chuck holder 53. Each positioning mechanism 84 comprises a stopper 85 including a stopper piston 88 which contacts one longitudinal edge of an arc-shaped projection 86 fixed on the driving pulley 77 for rotation therewith. As seen from FIG. 11, the projection 86 extends substantially along the peripheral edge of the driving pulley 77 and at an angle of 90° so that when one end contacts to one of the stopper pistons 88, the other end contacts to another stopper pin oriented at a position 90° offsetting. In order to firmly receive the stopper pistons 88 at both ends, stopper piston receptacle recesses 86a are formed at both ends of the projection 86.

As seen from FIG. 9, each stopper 85 comprises an air cylinder 87 through which the stopper piston 88 is thrustingly disposed. A pressure chamber 90 is defined above the top end of the stopper piston 88, which pressure chamber is connected to a pressurized air source (not shown) to introduce pressurized air therefrom. On the other hand, a spring seat clip 88a is fixed onto the intermediate portion of the stopper piston 88. Upper end of a coil spring 89 is seated on the spring seat clip 88a. The other end of the coil spring 89 is seated on a flange 75a formed at the lower end of a cylindrical boss section 75b of the cylinder body 75, through which boss section, the output shaft 76 extends downwardly from the cylinder body. The coil spring 89 thus constantly exerts an upward spring force to the stopper piston 88 so as to normally position the stopper piston at an upwardly shifted position, at which the lower end of the stopper piston is held away from the projection 86. On the other hand, the spring seat clip 88a also serves as a stopper for limiting upward motion of the stopper piston 88.

At a desired angular position of the driving pulley 77, which angular position corresponds to the desired angular position of the chuck holder 53, air cylinders 87 associated with the stopper pistons 88 opposing both ends of the projection 86 are actuated by the pressurized air introduced into the pressure chambers 90 for depressing the corresponding stopper pistons 88 downwardly to establish engagement between the stopper pistons and the stopper piston receptacle recesses 86a. By this, the driving pulleys 77 are locked at the desired angular position to lock the chuck holder 53.

Through the operation for pivotally driving the chuck holder 53 as set forth above, the angular position of the chucking claws 19a and 20a of the chucking arms 19 and 20 can be adjusted so as to chuck the desired portion of the electronic part 12.

Figure 12:
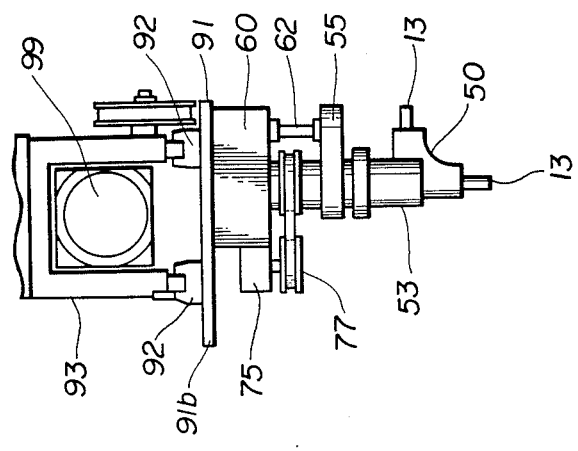
FIG. 12 is a side elevation of a transversely driving mechanism employed in the preferred embodiment of the assembling apparatus of the invention.

The transversely driving mechanism 16 has a movable bracket 91 carrying the base frame 60 of the axially driving mechanism 15, as shown in FIGS. 1 and 12. The movable bracket 91 is configured in an essentially L-shaped configuration to have a vertically extending section 91a and a horizontally extending section 91b. The base frame 60 of the axially driving mechanism 15 is rigidly secured on the lower surface of the horizontally extending section 91b. A pair of linear bearings 92 are mounted on the upper surface of the horizontally extending section 91b. The linear bearings 92 are slidingly engaged with lower ends of vertically extending sections 93a of an essentially channel shaped guide rail 93. The guide rail 93 extends transversely across the assembling apparatus. Both ends of the guide rail 93 are supported by vertically extending support frames 100 and 101.

As will be seen from FIG. 1, the support frames 100 and 101 extends from a main table 102. In front of the main table, an auxiliary table 103 is provided. The auxiliary table 103 is designed to mount thereon a mounting base 104, on which the substrate 14 is to be mounted.

The guide rail 93 has a horizontally extending section 93b extending between the vertically extending sections 93a. A pair of bearings 94 and 95 are mounted on the lower surface of the horizontally extending section 93b of the guide rail 93 and rotatably support a ball screw rod 97. As will be seen from FIG. 1, the ball screw rod 97 extends substantially in parallel to the guide rail 93. A cylindrical movement 96 engages with the screw rod 97 to be thrustingly driven therealong by rotation of the screw rod. In order to rotatingly drive the screw rod 97, an electric servo motor 99 is provided in the vicinity of one end of the screw rod. The output shaft 99a of the servo motor 99 is drivingly coupled with the screw rod 97 via an alignment jig 98. The cylindrical movement 96 is rigidly connected to the vertically extending section 91a of the movable bracket 91. Therefore, the movable bracket 91 can be driven in a direction parallel to the axis of the screw rod 97 by the servo motor 99.

In the shown embodiment, a coordinate system is established to control the position of the electronic part 12 as carried by the chuck mechanism 13 with respect to the substrate 14 mounted on the mounting base 104. As will be seen, the transversely driving mechanism 15 set forth above is designed to shift the chuck holder 53 carrying the chuck mechanism 13 along the axis of the screw rod 97. The direction of movement of the chuck mechanism 13 as driven by the transversely driving mechanism 15 in parallel to the axis of the screw rod 97 and in parallel to the plane of the substrate 14 on the mounting base 104 will be hereafter referred to as "x-axis direction" in the established coordinate system. As will be appreciated from the discussion given hereabove, the transversely driving mechanism 15 drives the chuck mechanism 13 only in the x-axis direction.

In order to adjust the relative position of the electronic part 12 and the substrate 14 in a y-axis direction which extends in a direction perpendicular to the x-axis direction and in parallel to the plane of the substrate, the mounting base 104 is designed to be driven in a direction for shifting the substrate 14 relative to the electronic part 12 in the direction. So as to move in the y-axis direction, the mounting base 104 is mounted on a pair of guide shafts 108 and 109 which respective extend through openings 110 and 111 formed through the mounting base. The guide shafts 108 and 109 extend in a direction parallel to the y-axis and in a parallel relationship to each other. The mounting base 104 is fixed to a pair of screw nuts 113 which are aligned to each other along the one lateral edge. The screw nuts 113 engage with ball screw rod 114 which is drivingly coupled with an electric servo motor 116 via an alignment jig 115. The screw rod 114 extends in the direction for driving the mounting base 104 in the direction by rotatingly driving the screw rod 11.

Figure 14:
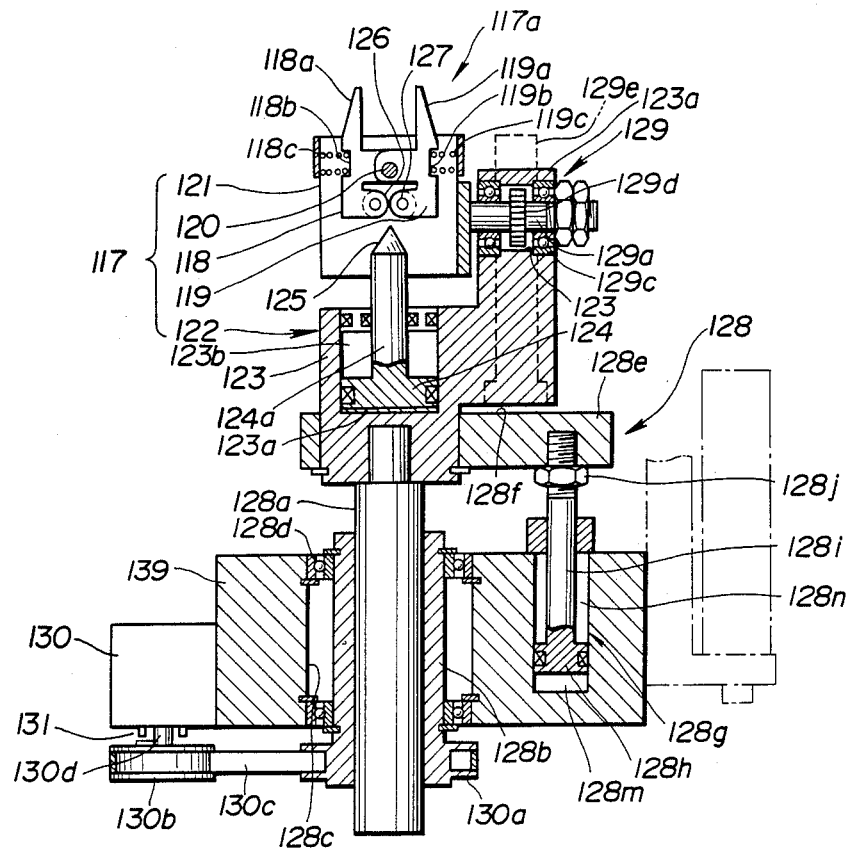
FIG. 14 is a section of an anvil mechanism to be employed in the preferred embodiment of the assembling apparatus.

Though it is not clearly shown in FIG. 1, an anvil mechanism is provided beneath the mounting base 104 for clamping the lower end of the pins 12a extending downwardly from the substrate 14 for fixing the electronic part 12 on the substrate, which anvil mechanism is generally represented by the reference numeral 117. The anvil mechanism 117 employed in the shown embodiment of the assembling apparatus is shown in FIG. 14. As shown in FIG. 14, the anvil mechanism 117 comprises a pair of movable arms 118 and 119 which respectively have anvil edges 118a and 119a. These movable arms 118 and 119 are pivotable about a common pivot 120. The pivot 120 extends from the inner periphery of an anvil houses 121 which housing the aforementioned assembly of movable arms. The movable arms 118 and 119 are formed with recesses 118b and 119b on the side edges at the sides remote from the other movable arms. The recesses 118b and 119b receive one ends of coil springs 118c and 119c. The other end of the coil springs 118c and 119c are seated on the inner periphery of the side walls of the anvil housing 121. The coil springs 118c and 119c are so oriented as to bias respectively associated movable arms 118 and 119 in a direction to normally maintain the anvil edges 118a and 119a in a positioned shifted away from each other, as shown in FIG. 14. The aforementioned assembly, of the movable arms will be hereafter referred to as the "anvil edge assembly 117a".

The anvil edge assembly 117a is associated with an actuating air cylinder 122. The air cylinder 122 comprises a cylindrical cylinder body 123. A piston 124 is disposed within the internal space of the cylinder body in a thrusting fashion. The piston 124 carries a piston rod 124a which extends upwardly from the piston. The piston rod 124a has a conical head 125 at the top thereof. The conical head 125 opposes the anvil edge assembly 117a. Opposing the conical head 125 of the piston rod 124a, rollers 126 and 127 are mounted on the lower end portion of the movable arms 118 and 119 in a mutually opposing relationship to each other. The movable arms 118 and 119 are normally biased to be maintained at the position of FIG. 14.

Pressure chambers 123a and 123b are defined in the cylinder body 123, which pressure chambers are communicated with a pressurized air source (not shown) to introduce therefrom the pressurized air. The piston 124 with the piston rod 124a is normally maintained at the lowered position, at which the conical head 125 is held away from the rollers 126 and 127. When the pressure in the pressure chamber 123a is increased, the piston 124 with the piston rod 124a is lifted upwardly. Then, the conical head 125 enters into a gap between the rollers 126 and 127 against the spring force of the coil springs 118c and 119c. By this, the rollers 126 and 127 are shifted way from each other to approach the anvil edges 118a and 119a. At this position, the anvil edge 118a and 119a can grip the pin 12a of the electronic part 12 for clamping the lower end thereof.

The anvil edge assembly 117a is also associated with a rotatingly driving mechanism 129. The rotatingly driving mechanism 129 is provided with the cylinder body 123 which has upward extension 123a with a through opening 123b, in which the rotatingly driving mechanism is received. The rotatingly driving mechanism 129 has generally an identical construction to the rotatingly driving mechanism 74 shown in FIG. 10. Namely, the rotatingly driving mechanism 129 includes a rotary shaft 129a rigidly connected to the anvil housing 121 for rotation therewith and rotatably supported in the through opening 123b of the extension 123 via bearings 129c. A pinion 129d is rigidly secured on the rotary shaft 129a. The pinion 129d engages with a rack (not shown) firmly attached to a piston rod of an air cylinder 129e, which is shown by broken line in FIG. 15. The construction of the air cylinder 129e is not clearly shown in FIG. 15. However, it should be appreciated that the air cylinder is of identical construction to that illustrated in FIG. 10.

Figure 15:
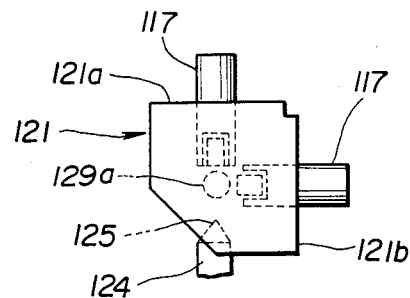
FIG. 15 is a side elevation of the anvil mechanism.

The rotatingly driving mechanism 129 thus pivotally drives the anvil edge assembly 117a by rotatingly driving the rotary shaft 129a. By pivotal movement of the anvil edge assembly 117a, two anvil mechanisms 117 which are mounted on the anvil housing 121 in a positions mutually offset 90° in angle, as shown in FIG. 15, can be selectively used.

The anvil edge assembly 117a is further associated with a vertically driving mechanism 128 which has substantially the same construction as that discussed with respect to the axially driving mechanism 15 of the chuck mechanism 13. Namely, the vertically driving mechanism 128 comprises a vertical extending guide shaft 128a which thrustingly extends through a rotary sleeve 128b which is rotatably supported in a through opening 128c formed through a base frame 139 via bearings 128d. A plate member 128e is rotatably engaged to the lower portion of the cylinder body 123. The plate member has an upper surface 128f mating with the lower surface of the extension 123a. The plate member 128e is associated with an air cylinder 128g having a piston 128h with a piston rod 128i. The piston rod 128i has a threaded top fixed with the plate member 128e by means of fastening nut 128j. With this construction, by adjusting the pressure in the upper and lower pressure chambers 128k and 128m, the anvil edge assembly 117a is lifted up and down to move toward and away from the mounting base 104 on which the substrate 14 is mounted.

Similarly to that illustrated in FIG. 6, a driven pulley 130a is fixed to the rotary sleeve 128b. The driven pulley 130a is connected to a driving pulley 130b via a driving belt 130c. The driving pulley 130b is drivingly connected to the output shaft 130d of a servo motor 130 which has an identical construction to that illustrated in FIG. 8. With this construction, the cylinder body 123 is rotatingly driven by the driving force of the servo motor 130 in a horizontal direction. This rotatingly driving mechanism is associated with a positioning mechanism 131 which has identical construction as illustrated in FIGS. 9 and 11. By this rotatingly driving mechanism in cooperation with the positioning mechanism 131, the anvil edge assembly 117a can be pivotally displaced and positioned at an initial and at positions 90°, 180° and 270° shifted position from the initial position.

In the shown embodiment, the anvil mechanism 117 has to be positioned in vertical alignment with the chuck mechanism 13. Therefore, the anvil mechanism 117 has to be driven to the orientation in the x-y coordinate system in synchronism with movement of the chuck mechanism 13. For this purpose, a transversely driving mechanism 132 for the anvil mechanism 117 in cooperation with the transversely driving mechanism 16 of the chucking mechanism 13 is provided. As set forth, the transversely driving mechanism 132 is designed to horizontally drive the anvil mechanism 117 in an x-axis direction in synchronism with the x-axis direction movement of the chuck mechanism 13.

Figure 16:
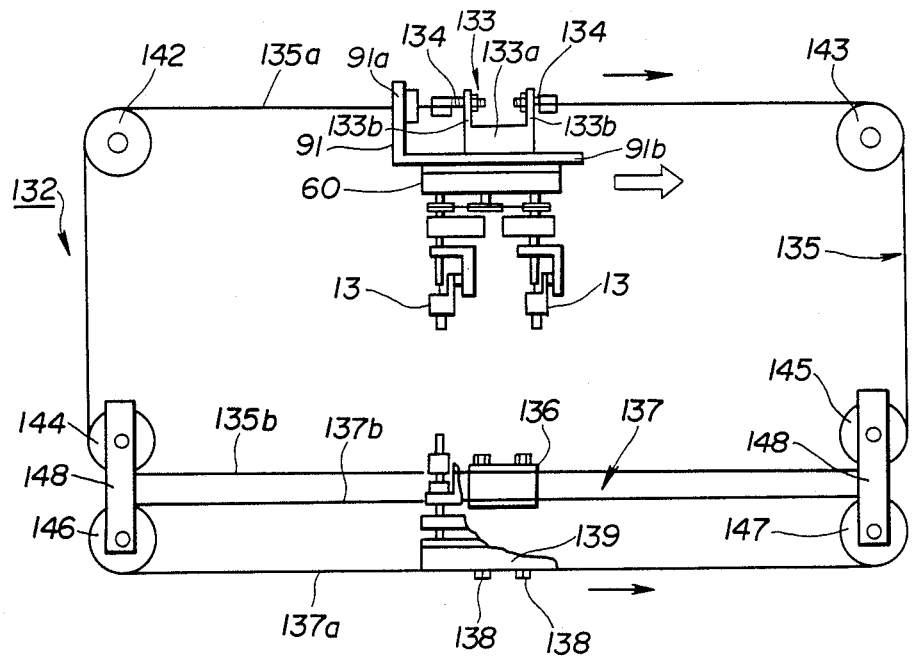
FIG. 16 is a front elevation of a driving mechanism for the anvil mechanism of FIG. 15 for driving the anvil mechanism in a transverse direction.

As shown in FIG. 16, a channel shaped retainer 133 is mounted on the horizontally extending section 91b of the L-shaped mounting bracket 91. The retainer 133 has a horizontally extending section 133a secured on the horizontally extending section 91b of the mounting bracket 91 and a pair of vertically extending sections 133b. To the vertically extending sections 133b, tension adjuster bolts 134 are engaged. To the tension adjuster bolts 134, both ends of a steel belt 135 are secured. The steel belt 135 extends along a path defined by means of guide pulleys 142, 143, 144 and 145. The steel belt 135 is coupled with an endless steel belt 137 by means of a coupling device 136. The base frame 139 of the anvil mechanism 117 is rigidly fixed to the steel belt 137 by means of fastening means, such as fastener bolts. The steel belt 137 extends in a path defined by the guide pulleys 146 and 147 which are mounted on common brackets 148 to the guide pulleys 144 and 145.

Figure 17:
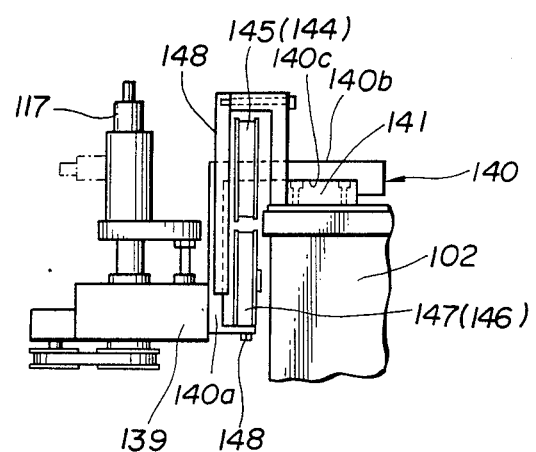
FIG. 17 is a side elevation of the transversely driving mechanism of the anvil mechanism.

As seen from FIG. 17, the base frame 139 is rigidly secured to essentially L-shaped support 140. The support 140 has a vertically extending section 140a, on which the base frame 139 is secured, and a horizontally extending section 140b. A recess 140c is formed on the lower section of the horizontally extending section 140b for engaging with guide rails 141 which are mounted on the main table 102 and extend essentially parallel to each other and in a direction parallel to the x-axis of the coordinate system.

With the construction set forth above, the steel belt 137 is driven with the belt 135 according to movement of the mounting frame 91 which carries the chuck mechanism 13. Therefore, synchronous movement of the chuck mechanism 13 and the anvil mechanism 117 can be established.

In the practical operation of the assembling apparatus, the chuck mechanism 13 is selected in relation to the electronic part 12 to be assembled to the substrate 14. Simultaneously, one of two anvil mechanisms 117 is selected according to the type of the electronic part 12. Therefore, the rotatingly driving mechanisms 51 and 129 are driven to drive the chuck housing 50 and the anvil housing 121 according to the selection of the chuck mechanism 13 and the anvil mechanism 117 to be used.

It may be possible to facilitate automatic selection of the chuck mechanisms 13 and the anvil mechanisms 117 according to a preliminary set program which may include information of the type of the electronic parts 12 and orientation of the parts to be assembled in the coordinate system. The program may also include information to set the angular positions of the chuck holder 53 and the anvil mechanism 117. For adjustment of the angular positions of the chuck holder 53 and the anvil mechanism 117, the servo motors 75 and 130 are driven to cause pivotal movements of the chuck holder 53 and the anvil mechanism 117 in horizontal direction. The angular positions of the pivoting chuck holder 53 and the anvil mechanism 117 may be monitored. In order to monitor the angular positions of the chuck holder 53 and the anvil mechanism 117, position sensors which monitor position of the piston or piston rod of the air cylinder or monitor magnitude of angular displacement of pinion may be provided. When the chuck holder 53 and the anvil mechanism 117 at the predetermined angular positions are detected, the stoppers 85 of the positioning mechanisms 84 and 131 are driven by introducing pressurized air into the pressure chamber 90, which stoppers are respectively oriented at the angular position to set the chuck holder 53 and the anvil mechanism 117.

When both of the chuck holder 53 and the anvil mechanism 117 are positioned through the foregoing process to determine the angular positions, the chuck mechanism 13 and the anvil mechanism 117 are oriented in vertical alignment to each other.

After initial setting through the process set forth above, the transversely driving mechanism 16 is driven to cause shifting of the chuck mechanism 13. Initially, the chuck mechanism 13 is shifted to a chucking station, to which electronic parts 12 are supplied from a parts supply device (not shown). At the chucking station, the axially driving mechanism 15 is driven to shift the chuck mechanism downwardly to set the chuck mechanism at the vertical orientation for chucking the electronic part 12 to be assembled.

During the aforementioned initial operation, the air pressure in the pressure chamber 28 is held higher than that in the pressure chamber 29 for maintaining the piston 30 at the downwardly shifted position. As a result, the movable arms 19 and 20 are held away from each other. When the chuck mechanism 13 is placed at a position for chucking the electronic part 12, the pressure in the pressure chamber 29 is increased and the pressure in the pressure chamber 28 is decreased. This causes upward movement of the piston 30. At the upwardly shifted position of the piston 30, the general section 30b comes to contact with the rollers 32 and 33 for shifting the movable arms 19 and 20 to approach the chucking claws 19a and 20a. Thus, the electronic part 12 is chucked at the chuck mechanism 13.

Then, the axially driving mechanism 15 is again driven to shift the chuck mechanism 13 upwardly while holding the electronic part 12. After the chuck mechanism 13 reaches the predetermined vertical position, the transversely driving mechanism 16 is driven to shift the chuck mechanism 13 in an x-axis direction. The magnitude of transverse shift of the chuck mechanism 13 may be controlled by continuously monitoring the position of the chuck mechanism transversely shifted or by monitoring magnitude of revolution of the servo motor 99 so that the chuck mechanism 13 can be transversely positioned at a position, at which the electronic part 12 is to be assembled to the substrate 14.

The servo motor 116 may also be driven to drive the ball screw rod 114 for a controlled magnitude to shift the mounting base 104 in a y-axis direction to position the openings 14 of the substrate in alignment with the pins 12 of the electronic part 12.

During transverse movement of the chuck mechanism 13, the anvil mechanism 117 is synchronously shifted in a transverse direction to maintain vertical alignment with the chuck mechanism 13. Therefore, when the electronic part 12 carried by the chuck mechanism 13 is placed to align the pins 12a to the openings 14a of the substrate 14, the anvil mechanism 117 is placed below the substrate in alignment with the electronic part.

Then, the axially driving mechanism 15 is again driven to drive the chuck mechanism 13 downwardly. Downward movement of the chuck mechanism 13 is monitored by monitoring the vertical position of the chuck mechanism or the spline shaft 56. When the chuck mechanism 13 is at position where the pins 12a of the electronic part 12 are inserted into the openings 14a of substrate 14 in a magnitude of 0.5 mm to 1 mm, the axially driving mechanism terminates operation.

At this position, the pressurized air is again introduced into the air chamber 28 to increase the pressure therein and the air in the air chamber 29 is ventilated to reduce the pressure therein. As a result, the piston 30 is driven downwardly to oppose the smaller diameter section 30a to the rollers 32 and 33. Therefore, the chucking arms 19 and 20 are pivotally shifted by the spring force of the springs 34 to release the chucking claws 19a and 20a from engagement with the electronic part 12.

By releasing the chucking arms 19 and 20, the electronic part 12 becomes free from restriction. At this position, the biasing force of the spring 42 which is exerted through the actuator head 35, becomes active to depress the electronic part 12 in order to further insert the pins 12a into the openings 14a of the substrate 14. The magnitude of insertion of the pins 12a is then monitored by means of the photo-microsensor 46 which monitors the position of the top of the rod member 45. In case the stroke of the spring 42 is not enough to fully insert the pins 12a through the openings 14a of the substrate 14, the controlled pressure of pressurized air is introduced into the pressure chamber 41 for further depressing the actuator head 35 until the photo-microsensor 46 detects the fully inserted position of the rod member 45.

It should be again noted that the spring force of the spring 42 is adjusted so as not to be strong to damage or bent the pins 12a even when the pins are offset from the corresponding openings 14a. Likewise, the pressure to be introduced into the pressure chamber 41 is adjusted so as not to be too great to cause damaging or bending of the pins by means of the pressure regulator valve 43.

The anvil mechanism 117 is cooperatively and symmetrically operated with the aforementioned pin inserting operation to clamp the lower end of the pins 12a. In the practical operation, the anvil mechanism 117 may be triggered into operation in response to the signal from the photo-microsensor 46 so that it may clamp the lower end of the pins after completion of the insertion of the pins.

As will be appreciated herefrom, since the assembling apparatus according to the invention performs assembling operation for inserting the pins of the electronic parts into the openings formed through the substrate with relatively light force which may not cause damaging or bending of the pins, yield in assembling operation can be significantly improved. Furthermore, since the clamping operation for clamping the pins is performed after completion of insertion of the pins, unnecessary step to be manually performed for removing the electronic parts which is assembled and clamped in inaccurate attitude, can be successfully avoided. This may improve efficiency of an assembling operation.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A method for assembling an electronic and/or electric part on a substrate, which part has an connector pin to be inserted through an opening formed through said substrate, comprising the steps of:

holding said part;

carrying said part to a predetermined orientation in relation to said substrate, at which said pin of said part is aligned to said opening;

shifting said part toward said substrate for inserting said pin into said opening;

monitoring magnitude of shifting of said part to detect at a predetermined position relative to said substrate, at which said opening is inserted into said opening in a first predetermined small magnitude;

detecting said part at said predetermined position, for stopping shift of said part toward said substrate;

releasing said part from holding;

exerting a second controlled magnitude of depression force greater than the first force to further insert said pin through said opening in response to releasing of holding;

monitoring position of said part to detect the position of the part where said pin is fully inserted through said opening; and monitoring means detecting said fully inserted position of said pin, for clamping end of said pin for fixing said part on said substrate.

2. A method as set forth in claim 1, wherein said depression force is set at a magnitude determined in view of bending strength of said pin and is set smaller than said bending strength.

3. A method as set forth in claim 2, wherein said depression force comprises a mechanical component mechanically and resiliently generated and a pneumatic component pneumatically generated.

4. A method as set forth in claim 3, wherein said mechanical component of said depression force is maintained at pre-loaded condition while said parts is held and normally exerts said depression force to said part.

5. A method as set forth in claim 4, wherein said pneumatic component which is cooperative with said mechanical component and active after said mechanical component completes depression for its own full stroke for depression.

6. An apparatus for assembling an electronic and/or electric part on a substrate, which part has a connector pin to be inserted through an opening formed through said substrate, comprising:

means for holding said part and carrying the latter to a predetermined orientation in relation to a substrate, at which said pin of said part is aligned to said opening;

means for shifting said part holding means toward said substrate for inserting said pin into said opening;

means, cooperative with said shifting means, for monitoring a magnitude of shifting of said part holding means to detect said part holding means at a predetermined position relative to said substrate, at which said pin is inserted into said opening in a first predetermined small magnitude;

means, responsive to said monitoring means detecting said part holding means at said predetermined position, for deactivating said shifting means and releasing said part holding means;

means, responsive to said deactivating means releasing holding, for exerting a second controlled magnitude of depression force greater than said first predetermined small magnitude to further insert said pin through said opening means for monitoring position of said part to detect the position of the part where said pin is fully inserted through said opening; and means, responsive to said part position monitoring means detecting said fully inserted position of said pin, for clamping end of said pin for fixing said part on said substrate.

7. An apparatus as set forth in claim 6, wherein said depression force exerting means exerts the depression force, magnitude of which is determined in view of bending strength of said pin and is set smaller than said bending strength.

8. An apparatus for assembling an electronic and/or electric part on a substrate, which part has a connector pin to be inserted through an opening formed through said substrate, comprising:

means for holding said part and carrying the latter to a predetermined orientation in relation to a substrate, at which said pin of said part is aligned to said opening;

means for shifting said part holding means toward said substrate for inserting said pin into said opening;

means, cooperative with said shifting means, for monitoring magnitude of shifting of said part holding means to detect said part holding means at a predetermined position relative to said substrate, at which said pin is inserted into said opening in a predetermined small magnitude;

means, responsive to said monitoring means detecting said part holding means at said predetermined position, for deactivating said shifting means and releasing said part holding means;

means, responsive to said deactivating means releasing holding, for exerting a controlled magnitude of depression force to further insert said pin through said opening; wherein said magnitude is determined in view of the body strength of said pin and is set smaller then said body strength; means for monitoring position of said part to detect the position of the part where said pin is fully inserted through said opening;

means, responsive to said part position monitoring means detecting said fully inserted position of said pin, for clamping end of said pin for fixing said part on said substrate, wherein said depression force exerting means exerts the depression force, the magnitude of which is determined in view of bending strength of said pin and is set smaller than said bending strength; and wherein said depression force exerting means comprises a mechanical component which resiliently generates said depression force and a pneumatic component which pneumatically generates said depression force.

9. An apparatus as set forth in claim 8, wherein said mechanical component of said depression force exerting means is maintained at pre-loaded condition while said holding means holds said part and normally exert said depression force to said part.

10. An apparatus as set forth in claim 9, wherein said pneumatic component which is cooperative with said mechanical component and active after said mechanical component completes depression for its own full stroke for depression.

11. An apparatus as set forth in claim 8, wherein said clamping means is cooperative with said holding means so as to move in synchronism with movement of said holding means for being constantly positioned in alignment with said holding means across said substrate.

12. An apparatus as set forth in claim 8, wherein said holding means comprises a chuck mechanism for chucking said part, a chuck carrier mechanism carrying said chuck mechanism over said substrate for shifting said chuck mechanism on a plane substantially parallel to said substrate to position said chuck mechanism at said predetermined orientation, at which said pin of said part is aligned to said opening.

13. An apparatus as set forth in claim 12, wherein said chuck carrier mechanism comprises a pivotal component mounting said chuck mechanism and pivotally movable on said plane, and a linearly shifting component associated with said pivotal component for linearly shifting said chuck mechanism with said pivotal component at least in a first direction.

14. An apparatus as set forth in claim 13, which further comprises means for mounting said substrate, which mounting means is movable in a second direction perpendicular to said first direction for adjusting relative position of said chuck mechanism and said substrate in said second direction for aligning said pin to said opening.

15. An apparatus as set forth in claim 13, wherein said clamping means comprises a clamping edge, a clamping edge carrier including a pivotal component which is pivotally movable with carrying said clamping edge in synchronism with pivotal movement of said pivotal component of said holding means, and a linearly shifting component associated with said pivotal component for linearly shifting said clamping edge with said pivotal component in said first direction in synchronism with linear movement of said linearly shifting component of the said holding means.

16. An apparatus as set forth in claim 8, wherein said insertion monitoring means is detective of faulty insertion by detecting said part held at the position other than said position where said pin is fully inserted through said opening, to actuate said holding means for holding said part to remove from said substrate.

17. An apparatus for assembling an electronic and/or electric part on a substrate, which part has a connector pin to be inserted through an opening formed through said substrate, comprising:

means for holding said part and carrying the latter to a predetermined orientation in relation to a substrate, at which said pin of said part is aligned to said opening;

means for shifting said part holding means toward said substrate for inserting said pin into said opening;

means, cooperative with said shifting means, for monitoring magnitude of shifting of said part holding means to detect said part holding means at a predetermined position relative to said substrate, at which said pin is inserted into said opening in a first predetermined small magnitude;

means, responsive to said monitoring means detecting said part holding means at said predetermined position, for deactivating said shifting means and releasing said part holding means;

means, responsive to said deactivating means, for exerting a controlled magnitude of depression force further insert said pin through said opening, wherein said magnitude is determined in view of the body strength of said pin and is set smaller then said body strength;

means for monitoring position of said part to detect the position of the part where said pin is fully inserted through said opening;

means, responsive to said part position monitoring means detecting said fully inserted position of said pin, for clamping an end of said pin for fixing said part on said substrate, wherein said depression force exerting means exerts the depression force, the magnitude of which is determined in view of bending strength of said pin and is set smaller than said bending strength;

wherein said depression force exerting means comprises a mechanical component which resiliently generates said depression force and a pneumatic component which pneumatically generates said depression force;

wherein said insertion monitoring means is detective of faulty insertion by detecting said part held at a position other than said position where said pin is fully inserted through said opening, to actuate said holding means for holding said part to remove from said substrate; and;

which further comprises a jig for straightening said pin removed from said substrate, and said holding means carries said part, about which faulty insertion is detected, to said jig for repairing.

18. An apparatus as set forth in claim 16, wherein said holding means operates to re-align said part for re-alignment of said pin to said opening for re-insertion.

19. An apparatus for automatically assembling an electronic and/or electric part on a substrate, which part has a connector pin to be inserted through an opening formed through said substrate, comprising:

chucking means for chucking said part at a predetermined chucking station to which said part is supplied and carrying the latter to a predetermined orientation in relation to a substrate, at which said pin of said part is aligned to said opening, from said chucking station;

shifting means for driving said chucking means to cause shifting said chucking means in a direction perpendicular to said substrate and toward said substrate for inserting said pin into said opening;

releasing means, cooperative with said chucking means, for monitoring magnitude of shifting of said chucking means to detect said part at a predetermined position relative to said substrate, at which said pin is inserted into said opening in a first predetermined small magnitude in relation to a full stroke of insertion, deactivating said shifting means and operating said chucking means for release chucking for making said part free from said chucking means;

depressing means, responsive to said releasing means, for exerting a second controlled magnitude of depression force greater than said first magnitude to further insert said pin through said opening;

depression magnitude monitoring means for monitoring position of said part to detect the position of the part where said pin is fully inserted through said opening; and clamping means, responsive to said part position monitoring means detecting said fully inserted position of said pin, for clamping end of said pin for fixing said part on said substrate.

20. An apparatus as set forth in claim 19, wherein said depressing means exerts the depression force, magnitude of which is determined in view of bending strength of said pin and is set smaller than said bending strength.

21. An apparatus as set forth in claim 19, wherein said clamping means is cooperative with said chucking means so as to move in synchronism with movement of said chucking means for being constantly positioned in alignment with said chucking means across said substrate.

22. An apparatus as set forth in claim 19, wherein said insertion monitoring means is detective of faulty insertion by detecting said part held at the position other than said position where said pin is fully inserted through said opening, to actuate said chucking means for holding said part to remove from said substrate.

23. An apparatus for automatically assembling an electronic and/or electric part on a substrate, which part has a connector pin to be inserted through an opening formed through said substrate, comprising:

chucking means for chucking said part at a predetermined chucking station to which said part is supplied and carrying the latter to a predetermined orientation in relation to a substrate, at which said pin of said part is aligned to said opening, from said chucking station;

shifting means for driving said chucking means to cause shifting said chucking means in a direction perpendicular to said substrate and toward said substrate for inserting said pin into said opening;

releasing means, cooperative with said chucking means, for monitoring magnitude of shifting of said chucking means to detect said part at a predetermined position relative to said substrate, at which said pin is inserted into said opening in a first predetermined small magnitude in relation to a full stroke of insertion, deactivating said shifting means and operating said chucking means for releasing chucking for making said part free from said chucking means;

depressing means, responsive to said releasing means, for exerting a second controlled magnitude of depression force greater than said first magnitude to further insert said pin through said opening;

depression magnitude monitoring means for monitoring position of said part to detect the position of the part where said pin is fully inserted through said opening;

clamping means, responsive to said part position monitoring means detecting said fully inserted position of said pin, for clamping end of said pin for fixing said part on said substrate;

wherein said insertion monitoring means is detective of faulty insertion by detecting said part held at a position other than said position where said pin is fully inserted through said opening, to actuate said chucking means for holding said part to remove from said substrate; and which further comprises a jig for straightening said pin removed from said substrate, and said chucking means carries said part, about which faulty insertion is detected, to said jig for repairing.

24. An apparatus as set forth in claim 22, wherein said chucking means operates to re-align said part for re-alignment of said pin to said opening for re-insertion.

25. An apparatus for automatically assembling an electronic and/or electric part on a substrate, which part has a connector pin to be inserted through an opening formed through said substrate, comprising:

chucking means for chucking said part at a predetermined chucking station to which said part is supplied and carrying the latter to a predetermined orientation in relation to a substrate, at which said pin of said part is aligned to said opening, from said chucking station;

shifting means for driving said chucking means to cause shifting said chucking means in a direction perpendicular to said substrate and toward said substrate for inserting said pin into said opening;

releasing means, cooperative with said chucking means, for monitoring magnitude of shifting of said chucking means to detect said part at a predetermined position relative to said substrate, at which said pin is inserted into said opening in a predetermined small magnitude in relation to a full stroke of insertion, deactivating said shifting means and operating said chucking means for release chucking for making said part free from said chucking means;

depressing means, responsive to said releasing means, for exerting a controlled magnitude of depression force to further insert said pin through said opening;

depression magnitude monitoring means for monitoring position of said part to detect the position of the part where said pin is fully inserted through said opening; and clamping means, responsive to said part position monitoring means detecting said fully inserted position of said pin, for clamping end of said pin for fixing said part on said substrate;

wherein said depressing means exerts the depression force, magnitude of which is determined in view of bending strength of said pin and is set smaller than said bending strength; and wherein said depressing means comprises a mechanical component which resiliently generates said depression force and a pneumatic component which pneumatically generates said depression force.

26. An apparatus as set forth in claim 25, wherein said mechanical component of said depressing means is maintained at pre-loaded condition while said chucking means holds said part and normally exert said depression force to said part.

27. An apparatus as set forth in claim 26, wherein said pneumatic component which is cooperative with said mechanical component and active after said mechanical component completes depression for its own full stroke for depression.

28. An apparatus as set forth in claim 25, wherein said chucking means comprises a chuck mechanism for chucking said part, a chuck carrier mechanism carrying said chuck mechanism over said substrate for shifting said chuck mechanism on a plane substantially parallel to said substrate to position said chuck mechanism at said predetermined orientation, at which said pin of said part is aligned to said opening.

29. An apparatus as set forth in claim 28, wherein said chuck carrier mechanism comprises a pivotal component mounting said chuck mechanism and pivotally movable on said plane, and a linearly shifting component associated with said pivotal component for linearly shifting said chuck mechanism with said pivotal component at least in a first direction.

30. An apparatus as set forth in claim 29, which further comprises means for mounting said substrate, which mounting means is movable in a second direction perpendicular to said first direction for adjusting relative position of said chuck mechanism and said substrate in said second direction for aligning said pin to said opening.

31. An apparatus as set forth in claim 29, wherein said clamping means comprises a clamping edge, a clamping edge carrier including a pivotal component which is pivotally movable with carrying said clamping edge in synchronism with pivotal movement of said pivotal component of said chucking means, and a linearly shifting component associated with said pivotal component for linearly shifting said clamping edge with said pivotal component in said first direction in synchronism with linear movement of said linearly shifting component of the said chucking means.

32. An apparatus for assembling an electronic and/or electric part on a substrate, which part has a connector pin to be inserted through an opening formed through said substrate, comprising:
  means for holding said part and carrying the latter to a predetermined orientation in relation to a substrate, at which said pin of said part is aligned to said opening;
  means for shifting said part holding means toward said substrate for inserting said pin into said opening;
  means, cooperative with said shifting means, for monitoring a magnitude of shifting of said part holding means to detect said part holding means at a predetermined position relative to said substrate, at which said pin is inserted into said opening in a predetermined small magnitude;
  means, responsive to said monitoring means detecting said part holding means at said predetermined position, for deactivating said shifting means and releasing said part holding means;
  means, responsive to said deactivating means releasing holding, for exerting a controlled magnitude of depression force to further insert said pin through said opening; wherein said magnitude is determined in view of the body strength of said pin and is set smaller then said body strength;
  wherein means for monitoring position of said part to detect the position of the part where said pin is fully inserted through said opening; and
  means, responsive to said part position monitoring means detecting said fully inserted position of said pin, for clamping end of said pin for fixing said part on said substrate, wherein said holding means comprises a chuck mechanism for chucking said part, a chuck carrier mechanism carrying said chuck mechanism over said substrate for shifting said chuck mechanism on a plane substantially parallel to said substrate to position said chuck mechanism at said predetermined orientation, at which said pin of said part is aligned to said opening; and
  wherein said chuck carrier mechanism comprises a pivotal component mounting said chuck mechanism and pivotally movable on said plane, and a linearly shifting component associated with said pivotal component for linearly shifting said chuck mechanism with said pivotal component at least in a first direction.

33. An apparatus as set forth in claim 32, which further comprises means for mounting said substrate, which mounting means is movable in a second direction perpendicular to said first direction for adjusting relative position of said chuck mechanism and said substrate in said second direction for aligning said pin to said opening.

34. An apparatus as set forth in claim 32, wherein said clamping means comprises a clamping edge, a clamping edge carrier including a pivotal component which is pivotally movable with carrying said clamping edge in synchronism with pivotal movement of said pivotal component of said holding means, and a linearly shifting component associated with said pivotal component for linearly shifting said clamping edge with said pivotal component in said first direction in synchronism with linear movement of said linearly shifting component of the said holding means.

35. An apparatus for assembling an electronic and/or electric part on a substrate, which part has a connector pin to be inserted through an opening formed through said substrate, comprising:
  means for holding said part and carrying the latter to a predetermined orientation in relation to a substrate, at which said pin of said part is aligned to said opening;
  means for shifting said part holding means toward said substrate for inserting said pin into said opening;
  means, cooperative with said shifting means, for monitoring a magnitude of shifting of said part holding means to detect said part holding means at a predetermined position relative to said substrate, at which said pin is inserted into said opening in a first predetermined small magnitude;
  means, responsive to said monitoring means detecting said part holding means at said predetermined position, for deactivating said shifting means and releasing said part holding means;
  means, responsive to said deactivating means releasing holding, for exerting a controlled magnitude of depression force to further insert said pin through said opening; wherein said magnitude is determined in view of the body strength of said pin and is set smaller then said body strength; and
  wherein means for monitoring position of said part to detect the position of the part where said pin is fully inserted through said opening; and
  means, responsive to said part position monitoring means detecting said fully inserted position of said pin, for clamping end of said pin for fixing said part on said substrate;

wherein said insertion monitoring means is detective of faulty insertion by detecting said part held at the position other than said position where said pin is fully inserted through said opening, to actuate said holding means for holding said part to remove from said substrate; and which further comprises a jig for straightening said pin removed from said substrate, and said holding means carries said part, about which faulty insertion is detected, to said jig for repairing.

36. An apparatus as set forth in claim 35, wherein said holding means operates to realign said part for realignment of said pin to said opening for reinsertion.

37. An apparatus for automatically assembling an electronic and/or electric part on a substrate, which part has a connector pin to be inserted through an opening formed through said substrate, comprising:

chucking means for chucking said part at a predetermined chucking station to which said part is supplied and carrying the latter to a predetermined orientation in relation to a substrate, at which said pin of said part is aligned to said opening, from said chucking station;

shifting means for driving said chucking means to cause shifting said chucking means in a direction perpendicular to said substrate and toward said substrate for inserting said pin into said opening;

releasing means, cooperative with said chucking means, for monitoring magnitude of shifting of said chucking means to detect said part at a predetermined position relative to said substrate, at which said pin is inserted into said opening in a predetermined small magnitude in relation to a full stroke of insertion, deactivating said shifting means and operating said chucking means for release chucking for making said part free from said chucking means;

depressing means, responsive to said releasing means, for exerting a controlled magnitude of depression force to further insert said pin through said opening;

depression magnitude monitoring means for monitoring position of said part to detect the position of the part where said pin is fully inserted through said opening; and clamping means, responsive to said part position monitoring means detecting said fully inserted position of said pin, for clamping end of said pin for fixing said part on said substrate.

wherein said chucking means comprises a chuck mechanism for chucking said part, a chuck carrier mechanism carrying said chuck mechanism over said substrate for shifting said chuck mechanism on a plane substantially parallel to said substrate to position said chuck mechanism at said predetermined orientation, at which said pin of said part is aligned to said opening; and wherein said chuck carrier mechanism comprises a pivotal component mounting said chuck mechanism and pivotally movable on said plane, and a linearly shifting component associated with said pivotal component for linearly shifting said chuck mechanism with said pivotal component at least in first direction.

* * * * *